(12) United States Patent
Oya

(10) Patent No.: US 10,118,367 B2
(45) Date of Patent: Nov. 6, 2018

(54) THERMAL CONDUCTING SHEET AND METHOD FOR PRODUCING SAME

(71) Applicant: KITAGAWA INDUSTRIES CO., LTD., Aichi (JP)

(72) Inventor: Rika Oya, Inazawa (JP)

(73) Assignee: KITAGAWA INDUSTRIES CO., LTD., Aichi (JP)

(*) Notice: Subject to any disclaimer, the term of this patent is extended or adjusted under 35 U.S.C. 154(b) by 0 days.

(21) Appl. No.: 15/471,309

(22) Filed: Mar. 28, 2017

(65) Prior Publication Data
US 2017/0291391 A1 Oct. 12, 2017

(30) Foreign Application Priority Data

Apr. 6, 2016 (JP) ................... 2016-076405

(51) Int. Cl.
*B32B 7/02* (2006.01)
*B32B 27/08* (2006.01)
(Continued)

(52) U.S. Cl.
CPC ............ *B32B 7/02* (2013.01); *B29C 47/0004* (2013.01); *B29C 47/0021* (2013.01);
(Continued)

(58) Field of Classification Search
CPC ....... H01L 23/34; H01L 23/36; H01L 23/373; H01L 23/3731; H01L 23/3733; H01L 23/3735; H01L 23/3737; H01L 23/3738; H05K 7/20; H05K 7/2039; H05K 7/20436; H05K 7/20445; H05K 7/20472; H05K 7/20481; C08K 3/00; C08K 3/01; C08K 3/013; C08K 3/10; C08K 3/105;
(Continued)

(56) References Cited

U.S. PATENT DOCUMENTS 6,083,853 A    7/2000   Fujimoto et al.
6,140,258 A   10/2000   Fujimoto et al.
(Continued)

FOREIGN PATENT DOCUMENTS

JP        3434186       5/2003
JP     2005-226007     8/2005
(Continued)

OTHER PUBLICATIONS

Machine translation (J-PlatPat) of JP 2012-007129 A. Translated Aug. 9, 2018. (Year: 2018).*

(Continued)

*Primary Examiner* — Maria V Ewald
*Assistant Examiner* — Ethan A. Utt
(74) *Attorney, Agent, or Firm* — Wenderoth, Lind & Ponack, L.L.P.

(57) ABSTRACT

A thermal conducting sheet having a high adhesion between layers even if the thermal conducting sheet has a multilayer structure is provided. The thermal conducting sheet including a low-hardness layer and a reinforcing layer laminated on one side or both sides of the low-hardness layer. The reinforcing layer having a hardness greater than a hardness of the low-hardness layer. The low-hardness layer comprises: acrylic polymer, silicon carbide, aluminum hydroxide, magnesium hydroxide, and plasticizer.

12 Claims, 4 Drawing Sheets

(51) Int. Cl.
| | | |
|---|---|---|
| *B32B 27/30* | (2006.01) | |
| *B32B 27/20* | (2006.01) | |
| *B29C 47/00* | (2006.01) | |
| *B29C 47/02* | (2006.01) | |
| *B29C 47/06* | (2006.01) | |
| *B29C 47/88* | (2006.01) | |
| *H05K 7/20* | (2006.01) | |
| *H01B 1/02* | (2006.01) | |
| *H01B 1/04* | (2006.01) | |
| *B32B 7/04* | (2006.01) | |
| *B32B 7/06* | (2006.01) | |
| *B32B 27/22* | (2006.01) | |
| *B32B 37/15* | (2006.01) | |
| *B29K 33/00* | (2006.01) | |
| *B29K 105/16* | (2006.01) | |
| *B29K 509/02* | (2006.01) | |
| *B29K 105/00* | (2006.01) | |
| *B29L 9/00* | (2006.01) | |
| *B29L 7/00* | (2006.01) | |

(52) U.S. Cl.
CPC .......... *B29C 47/025* (2013.01); *B29C 47/065* (2013.01); *B29C 47/8805* (2013.01); *B32B 7/04* (2013.01); *B32B 7/06* (2013.01); *B32B 27/08* (2013.01); *B32B 27/20* (2013.01); *B32B 27/22* (2013.01); *B32B 27/308* (2013.01); *B32B 37/15* (2013.01); *H01B 1/023* (2013.01); *H01B 1/04* (2013.01); *H05K 7/20481* (2013.01); *B29K 2033/12* (2013.01); *B29K 2105/0038* (2013.01); *B29K 2105/16* (2013.01); *B29K 2509/02* (2013.01); *B29K 2995/0013* (2013.01); *B29L 2007/002* (2013.01); *B29L 2009/00* (2013.01); *B32B 2250/02* (2013.01); *B32B 2250/24* (2013.01); *B32B 2250/246* (2013.01); *B32B 2250/40* (2013.01); *B32B 2264/10* (2013.01); *B32B 2264/102* (2013.01); *B32B 2264/107* (2013.01); *B32B 2307/302* (2013.01); *B32B 2307/536* (2013.01); *B32B 2307/732* (2013.01); *B32B 2307/748* (2013.01); *B32B 2457/00* (2013.01)

(58) Field of Classification Search
CPC ... C08K 3/11; C08K 3/14; C08K 3/18; C08K 3/20; C08K 3/22; C08K 3/34; C08K 5/00; C08K 5/0008; C08K 5/0016; C08K 13/00; C08K 13/02; C08K 13/04; C08K 2003/2217; C08K 2003/2224; C08K 2003/2227; C08K 2201/00; C08K 2201/001; C08K 2201/002; C08K 2201/003; C08K 2201/004; C08K 2201/005; C08K 2201/009; C08L 33/08; C08L 33/10; C08L 33/12; B32B 27/00; B32B 27/04; B32B 27/06; B32B 27/08; B32B 27/18; B32B 27/20; B32B 27/22; B32B 27/30; B32B 27/308; B32B 7/00; B32B 7/02; B32B 7/04; B32B 5/16; Y10T 428/31855; Y10T 428/31909; Y10T 428/31928; Y10T 428/31935; Y10T 428/25; Y10T 428/254; Y10T 428/256; Y10T 428/258; Y10T 428/24942; Y10T 428/24983; Y10T 428/24355; Y10T 428/24372; Y10T 428/2438; Y10T 428/24388; Y10T 428/24413
USPC ....... 428/500, 515, 520, 522, 323, 327, 328, 428/330, 212, 217, 141, 143, 144, 145, 428/148

See application file for complete search history.

(56) References Cited

U.S. PATENT DOCUMENTS

| | | | |
|---|---|---|---|
| 6,660,203 B1 | 12/2003 | Fujimoto et al. | |
| 2007/0179223 A1* | 8/2007 | Hiroshige | C08L 33/04 524/100 |
| 2007/0224426 A1* | 9/2007 | Yoda | H01L 23/3737 428/409 |
| 2007/0231552 A1* | 10/2007 | Yoda | H01L 23/3737 428/209 |
| 2007/0231560 A1* | 10/2007 | Zhang | H01L 23/3733 428/323 |
| 2007/0240310 A1* | 10/2007 | Zhang | H05K 7/20481 29/890.03 |
| 2008/0081859 A1* | 4/2008 | Yoda | C08K 3/22 524/323 |
| 2010/0009109 A1 | 1/2010 | Ozawa | |
| 2010/0314573 A1* | 12/2010 | Yoda | C08K 3/013 522/104 |
| 2011/0245373 A1* | 10/2011 | Yoda | H01L 23/3737 523/220 |
| 2013/0189514 A1* | 7/2013 | Nishiyama | H01L 23/3737 428/323 |
| 2014/0079913 A1* | 3/2014 | Nishiyama | B32B 27/20 428/141 |
| 2015/0004388 A1* | 1/2015 | Kawaguchi | C09K 5/14 428/328 |

FOREIGN PATENT DOCUMENTS

| | | | |
|---|---|---|---|
| JP | 2007211141 A | * | 8/2007 |
| JP | 2012007129 A | * | 1/2012 |

OTHER PUBLICATIONS

Machine translation (Google patents) of JP 2007-211141 A. Translated Aug. 30, 2018. (Year: 2018).*

\* cited by examiner

THERMAL CONDUCTING SHEET AND METHOD FOR PRODUCING SAME

TECHNICAL FIELD

The present invention relates to a thermal conducting sheet and a method of producing the thermal conducting sheet.

BACKGROUND ART

Conventionally, a thermal conducting sheet filled with a thermal conducting filler such as silicon carbide and aluminum hydroxide, which is highly thermally conductive to an acrylic resin, has been used as a thermal conducting sheet to transfer heat generated from an electronic device or element to a heat sink (Patent Document 1).

Such a thermal conducting sheet requires low hardness because the sheet needs to be in close contact with an electronic device or element, which is a heat generator, with a gap as small as possible, while no weight is applied on the sheet. However, the low hardness of the sheet hinders a good handling of the sheet and deters shape recovery of the sheet after compressive deformation. Thus, there may be a problem of losing close contact with a heat generator or a heat sink.

Therefore, a thermal conducting sheet of a configuration, in which a thin sheet for reinforcement is adhered on a low-hardness sheet, has been proposed (Patent Document 2). It is expected that the thin sheet imparts strength to such a thermal conducting sheet, resulting in better handling and suppressing excessive compressive deformation of the low-hardness sheet.

CITATION LIST

Patent Literature

Patent Document 1: Japanese Unexamined Patent Application Publication No. 2005-226007A
Patent Document 2: Japanese Patent No. 3434186B

SUMMARY OF INVENTION

Technical Problem

However, interfacial adhesion between the low-hardness sheet and the reinforcing thin sheet may be insufficient in the configuration of simple bonding of the sheets, causing misalignment at the bonding interface between the low-hardness sheet and the reinforcing thin sheet during compressive deformation. In such a case, the low-hardness sheet subjected to compressive deformation may jut out relative to the thin sheet and may not recover to the original state, resulting in an insufficient adhesion between the thermal conducting sheet and the adherend.

The thermal conducting sheet according to an aspect of the present invention was completed under the consideration of the problems described above. The objective of the present invention is to provide a thermal conducting sheet having a high adhesion between layers even if the thermal conducting sheet has a multilayer structure, and the production method thereof.

Solution to Problem

In an aspect of the present invention, the following is provided:

A thermal conducting sheet including a low-hardness layer and a reinforcing layer laminated on one side or both sides of the low-hardness layer, the reinforcing layer having a hardness greater than a hardness of the low-hardness layer;

wherein the low-hardness layer comprises:

from 18 to 25 mass % of acrylic polymer, from 30 to 35 mass % of silicon carbide having an average particle size of from 60 μm to 100 μm, from 15 to 23 mass % of aluminum hydroxide having an average particle size of from 10 μm to 50 μm, from 18 to 30 mass % of magnesium hydroxide having an average particle size of from 1 μm to 2 μm, and from 1 to 5 mass % of plasticizer;

the reinforcing layer comprises:

from 20 to 30 mass % of acrylic polymer and from 60 to 80 mass % of aluminum hydroxide having an average particle size of from 10 μm to 50 μm; and the thermal conducting sheet comprises a bonding interfacial part, the bonding interfacial part including an interfacial portion; wherein the low-hardness layer and the reinforcing layer are mutually bonded in the interfacial portion, and each of the low-hardness layer and the reinforcing layer penetrates into the bonding interfacial part.

In such a configuration, adhesion between the low-hardness layer and the reinforcing layer can be improved because each of the low-hardness layer and the reinforcing layer penetrates into the bonding interfacial part, participating in the strong bonding between the low-hardness layer and the reinforcing layer. Even in a case where the low-hardness layer is under compressive deformation, misalignment of the low-hardness layer relative to the reinforcing layer is prevented, and excessive deformation of the low-hardness layer is suppressed. Thus, the adhesion of the thermal conducting sheet to the adherend is retained.

The thermal conducting sheet above may include a configuration described below.

The thermal conducting sheet may have a configuration, in which a part of the silicon carbide is disposed in the bonding interfacial part, the part of the silicon carbide penetrating into the reinforcing layer.

In such a configuration, silicon carbide, which is an abrasive and has a large size, penetrates into the reinforcing layer and acts as an anchor, resulting in improvement of the adhesion between the layers.

The thermal conducting sheet may have another configuration, in which a pair of the reinforcing layers is laminated on both sides of the low-hardness layer, and one of the pair of the reinforcing layers includes from 15 to 20 mass % of magnesium hydroxide having an average particle size of from 1 to 2 μm.

In a case where releasing sheets are provided on both sides of the thermal conducting sheet in such a configuration, the reinforcing layer of one side is easily released compared to the reinforcing layer of the other side. The difference in ease of release may improve the workability because the releasing sheet on the side of easier release can be removed selectively when the thermal conducting sheet is bonded on the adherend.

As for a method for producing the thermal conducting sheet, the following is provided:

A method for producing the thermal conducting sheet described above, including:

(i) mixing each of a composition material for the low-hardness layer and a composition material for the reinforcing layer individually, wherein:
the composition material for the low-hardness layer includes:
an acrylic resin including a polymer polymerized from a monomer containing (meth)acrylate, and (meth)acrylate,
a multifunctional monomer,
a thermal polymerization initiator,
a plasticizer,
silicon carbide,
aluminum hydroxide and
magnesium hydroxide; and
the composition material for the reinforcing layer includes:
an acrylic resin including a polymer that is polymerized from a monomer containing (meth)acrylate, and (meth)acrylate,
a multifunctional monomer,
a thermal polymerization initiator, and
aluminum hydroxide;
(ii) extruding each composition mixed in step (i) simultaneously into a space between a pair of polymer films facing each other via a die head having multiple outlets to form a multilayer material; and
(iii) curing the multilayer material extruded in step (ii) by heating the multilayer material.

In such a method, each mixture adjacent to each other may be blended with each other near the interface thereof in a manner that each mixture penetrates into the other, because each mixture extruded has still a low viscosity when extruded into a space between a pair of polymer films. Then, the composition materials, in which mixtures (layers) next to each other are blended, react together upon heating during curing. The composition materials are cured while polymerized or crosslinked. Thus, the thermal conducting sheet that has a bonding interfacial part described above can be obtained.

In the method described above, a configuration, in which the mixture of the composition material for the low-hardness layer may have a viscosity higher than that of the mixture of the composition material for the reinforcing layer, may be employed.

In such a configuration, silicon carbide, which has a large particle size and is included in the relatively high viscosity mixture of the low-hardness layer, can easily move into a relatively low viscosity mixture of the adjacent reinforcing layer, and a part of the silicon carbide can penetrates into the bonding interfacial part or the composition material for the reinforcing layer. Upon curing afterwards, the thermal conducting sheet, in which a part of silicon carbide is disposed in the bonding interfacial part in a manner that a part of the silicon carbide penetrates into the reinforcing layer, can be obtained.

Advantageous Effects of Invention

According to an aspect of the present invention, a thermal conducting sheet having a strong adhesion between layers is provided even if the thermal conducting sheet has a multilayer structure. And the production method thereof is also provided.

DESCRIPTION OF EMBODIMENTS

Figure 1:
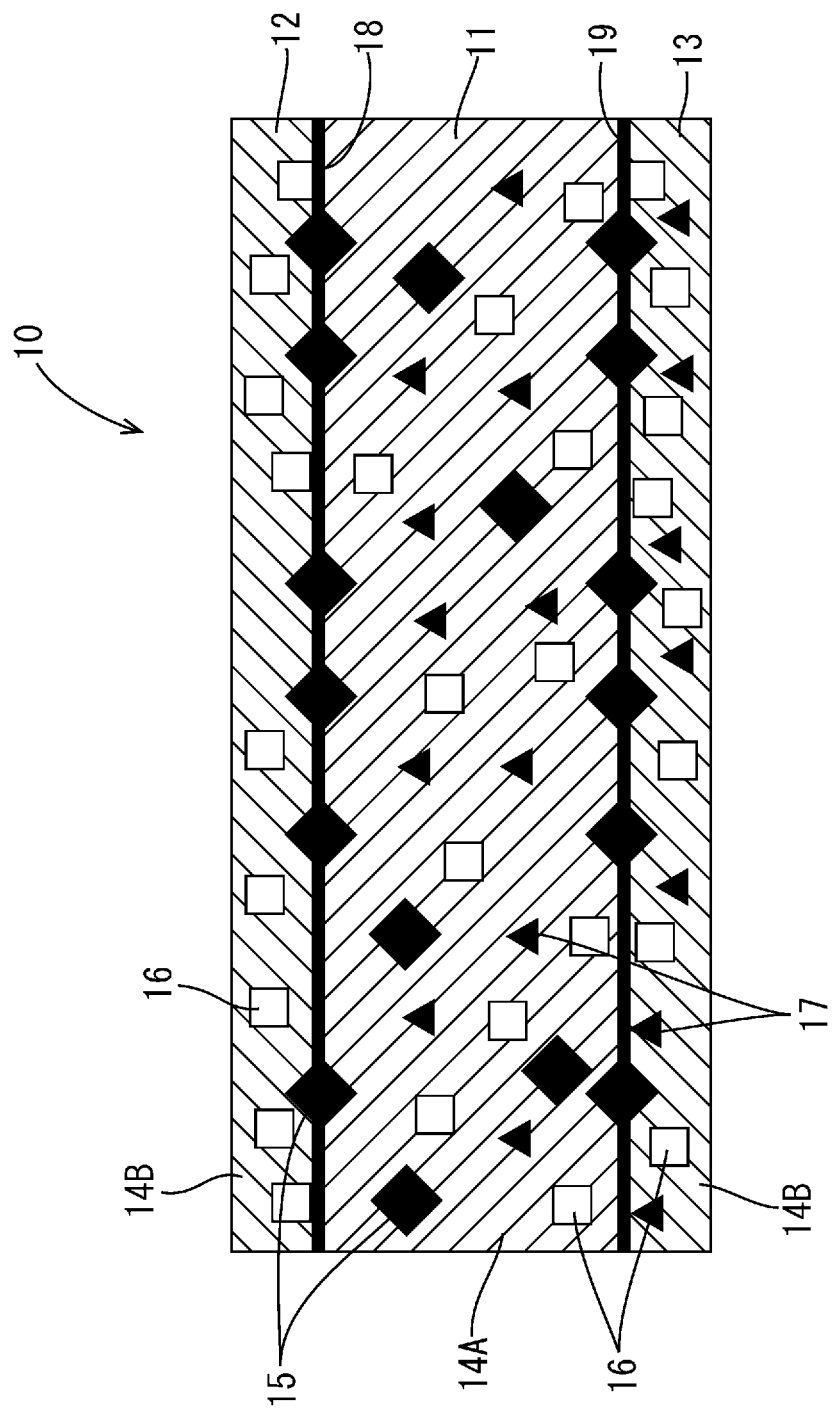
FIG. 1 is a cross-sectional view schematically illustrating a configuration of a thermal conducting sheet according to an embodiment of the present invention.

FIG. 1 is a cross-sectional view schematically illustrating a thermal conducting sheet 10 according to an embodiment of the present invention. In the description hereafter, an upward direction in FIG. 1 is referred to as "upward (up, upper, above, higher)" and a downward direction in FIG. 1 is referred to as "downward (down, below, lower)". In a thermal conducting sheet 10 illustrated in FIG. 1, a first reinforcing layer 12 and a second reinforcing layer 13, both of which have a greater hardness than that of the low-hardness layer 11, are each laminated on upper and lower sides of the low-hardness layer 11. Also, a first bonding interfacial part 18, which will be described below, is formed at an interfacial portion between the low-hardness layer 11 and the first reinforcing layer 12. Furthermore, a second bonding interfacial part 19, which will be described below, is formed at an interfacial portion between the low-hardness layer 11 and the second reinforcing layer 13.

In the low-hardness layer 11, silicon carbide 15, aluminum hydroxide 16, and magnesium hydroxide 17 are dispersed in an acrylic polymer 14A that is a base material. Also, in the first reinforcing layer 12, aluminum hydroxide 16 is dispersed in an acrylic polymer 14B that is a base material. Furthermore, in the second reinforcing layer 13, aluminum hydroxide 16, and magnesium hydroxide 17 are dispersed in an acrylic polymer 14B that is a base material.

In the present invention, acrylic polymer is a polymer or a copolymer of acrylic resin containing a polymer, which is obtained by polymerization of a monomer containing (meth)acrylate, and (meth)acrylate.

Examples of (meth)acrylate include ethyl (meth)acrylate, n-propyl (meth)acrylate, i-propyl (meth)acrylate, n-butyl (meth)acrylate, i-butyl (meth)acrylate, 2-ethyl hexyl (meta)(meth)acrylate, n-hexyl (meth)acrylate, n-amyl (meth)acrylate, i-amyl (meth)acrylate, octyl (meth)acrylate, i-octyl (meth)acrylate, i-myristyl (meth)acrylate, lauryl (meth)acrylate, nonyl (meth)acrylate, i-nonyl (meth)acrylate, i-decyl (meth)acrylate, tridecyl (meth)acrylate, stearyl (meth)acrylate, and i-stearyl (meth)acrylate. These may be used alone or in combination upon (co)polymerization.

An acrylic polymer can be obtained by adding an additive such as a multifunctional monomer, a polymerization initiator, and a plasticizer, to the above described acrylic resin as appropriate, followed by heating and curing.

Examples of the multifunctional monomer include a multifunctional monomer having two or more (meth)acryloyl groups in a molecule. Examples of the di-functional (meth)acrylate monomer having two (meth)acryloyl groups include 1,3-butylene glycol di(meth)acrylate, 1,4-butanediol di(meth)acrylate, 1,6-hexanediol di(meth)acrylate, 1,9-nonanediol di(meth)acrylate, neopentyl glycol di(meth)acrylate, dicyclopentanyl di(meth)acrylate, 2-ethyl-2-butyl-propanediol (meth)acrylate, neopentylglycol-modified trimethylolpropane di(meth)acrylate, stearic acid-modified pentaerythritol diacrylate, polypropylene glycol di(meth) acrylate, 2,2-bis[4-(meth)acryloxy-diethoxyphenyl]propane, 2,2-bis[4-(meth)acryloxy-propoxyphenyl]propane, and 2,2-bis[4-(meth)acryloxy-tetraethoxyphenyl]propane.

Examples of tri-functional (meth)acrylate monomer include trimethylolpropane tri(meth)acrylate, and tris[(meth)acryloxyethyl]isocyanurate. Examples of multifunctional (meth)arylate monomer having 4 or more functional groups include dimethylolpropane tetra(meth)arylate, pentaerythritol tetra(meth)acrylate, pentaerythritol ethoxytetra(meth)acrylate, dipentaerythritol penta(meth)acrylate, and dipentaerythritol hexa(meth)acrylate.

Among these multifunctional monomers, 1,6-hexanediol di(meth)acrylate and the like are preferred.

The multifunctional monomer described above is preferably blended in from 0.005 to 0.015 parts by weight in the low-hardness layer and in from 0.05 to 0.10 parts by weight in the reinforcing layer relative to the acrylic resin of from 20 to 25 parts by weight.

Examples of the polymerization initiator include organic peroxides such as di-(4-t-butylcyclohexyl)peroxydicarbonate, lauroyl peroxide, t-amylperoxy-2-ethylhexanoate, benzoyl peroxide, and t-butylperoxy-2-ethylhexanoate. Among these polymerization initiators, di-(4-t-butylcyclohexyl)peroxydicarbonate is preferred.

The polymerization initiator is preferably blended in a ratio of from 0.1 to 0.3 parts by weight relative to the acrylic resin of from 20 to 25 parts by weight.

For a plasticizer, a generally used plasticizer can be used. For example, phthalate-based, adipate-based, phosphate-based, trimellitate-based or polyester-based plasticizer can be used suitably. Any one kind of these plasticizers can be used alone or two or more kinds of these plasticizers can be used as a mixture. Blending the plasticizer imparts flexibility to the thermal conducting sheet.

The plasticizer is preferably blended in a ratio of from 2.0 to 4.0 parts by weight relative to the acrylic resin of from 20 to 25 parts by weight. If the blending ratio of the plasticizer is too small, the effect of plasticizer addition is insufficient and the hardness of the thermal conducting sheet increases. If the blending ratio of the plasticizer is too large, the plasticizer may bleed from the surface of the thermal conducting sheet.

Furthermore, an antioxidant can be added as an additive. Examples of the antioxidant include a phenol-based antioxidant that is capable of capturing a radical. Blending such an antioxidant can suppress polymerization of the acrylic resin during sheet production hence lower hardness of the sheet.

The antioxidant is preferably blended in a ratio of from 0.05 to 0.10 parts by weight relative to the acrylic resin of from 20 to 25 parts by weight. If the blending ratio of the antioxidant is too small, polymerization of the acrylic resin may proceed excessively so that the hardness of the sheet becomes too large. If the blending ratio of the antioxidant is too large, curing of the resin may be hindered.

Meanwhile, silicon carbide 15 as a thermal conductive filler is particulate, and the particle size thereof can be represented by an average particle size D50 determined by a method such as laser diffraction. In the present embodiment, silicon carbide of an average particle size of from 60 to 100 μm is used.

If the average particle size of the silicon carbide is less than 60 μm, the bonding force with the reinforcing layer may diminish. If the average particle size of the silicon carbide is greater than 100 μm, the silicon carbide particles may fall off upon producing the thermal conducting sheet.

Meanwhile, aluminum hydroxide 16 as a thermal conductive filler is substantially spherical, and the particle size thereof can be represented by an average particle size D50 determined by a method such as laser diffraction. In the present embodiment, aluminum hydroxide of the average particle size of from 10 to 50 μm, preferably of from 30 to 50 μm, is used in the low-hardness layer, while aluminum hydroxide of the average particle size of from 10 to 50 μm is used in the reinforcing layer.

Magnesium hydroxide 17 as a thermal conductive filler is in the shape of a hexagonal plate, and the particle size thereof can be represented by an average particle size D50 determined by a method such as laser diffraction. In the present embodiment, magnesium hydroxide of the average particle size of from 1 to 2 μm is used. Inclusion of magnesium hydroxide of smaller size can increase the viscosity of the acrylic resin.

The thickness of the thermal conducting sheet 10 is preferably not less than 1 mm and not greater than 6 mm. More specifically, the thickness of the low-hardness layer 11 of the thermal conducting sheet 10 is preferably not less than 0.4 mm and not greater than 5.6 mm in a case where the reinforcing layers 12 and 13 are disposed on the both sides of the low-hardness layer 11, while the thickness of the low-hardness layer 11 of the thermal conducting sheet 10 is preferably not less than 0.7 mm and not greater than 5.8 mm in a case where the reinforcing layer is disposed only on one side of the low-hardness layer 11. The thickness of the reinforcing layers 12 and 13 is preferably not less than 0.2 mm and not greater than 0.3 mm. The Asker C hardness of the low-hardness layer 11 is preferably from 0 to 5 and the Asker C hardness of the reinforcing layers 12 and 13 is preferably from 30 to 50. If the hardness is within these ranges, formability is superior and the compressive force can be suppressed.

For example, the thermal conducting sheet 10 of the three-layer structure can be obtained as follows: (i) mixing each of the composition material for the low-hardness layer 11, the composition material for the first reinforcing layer 12, and the composition material for the second reinforcing layer 13 individually, (ii) extruding each mixture mixed in step (i) to a space between a pair of polymer films facing each other via a die head having multiple outlets, to form a multilayer material, (iii) curing the multilayer material extruded in step (ii) by heating the multilayer material.

Figure 4:
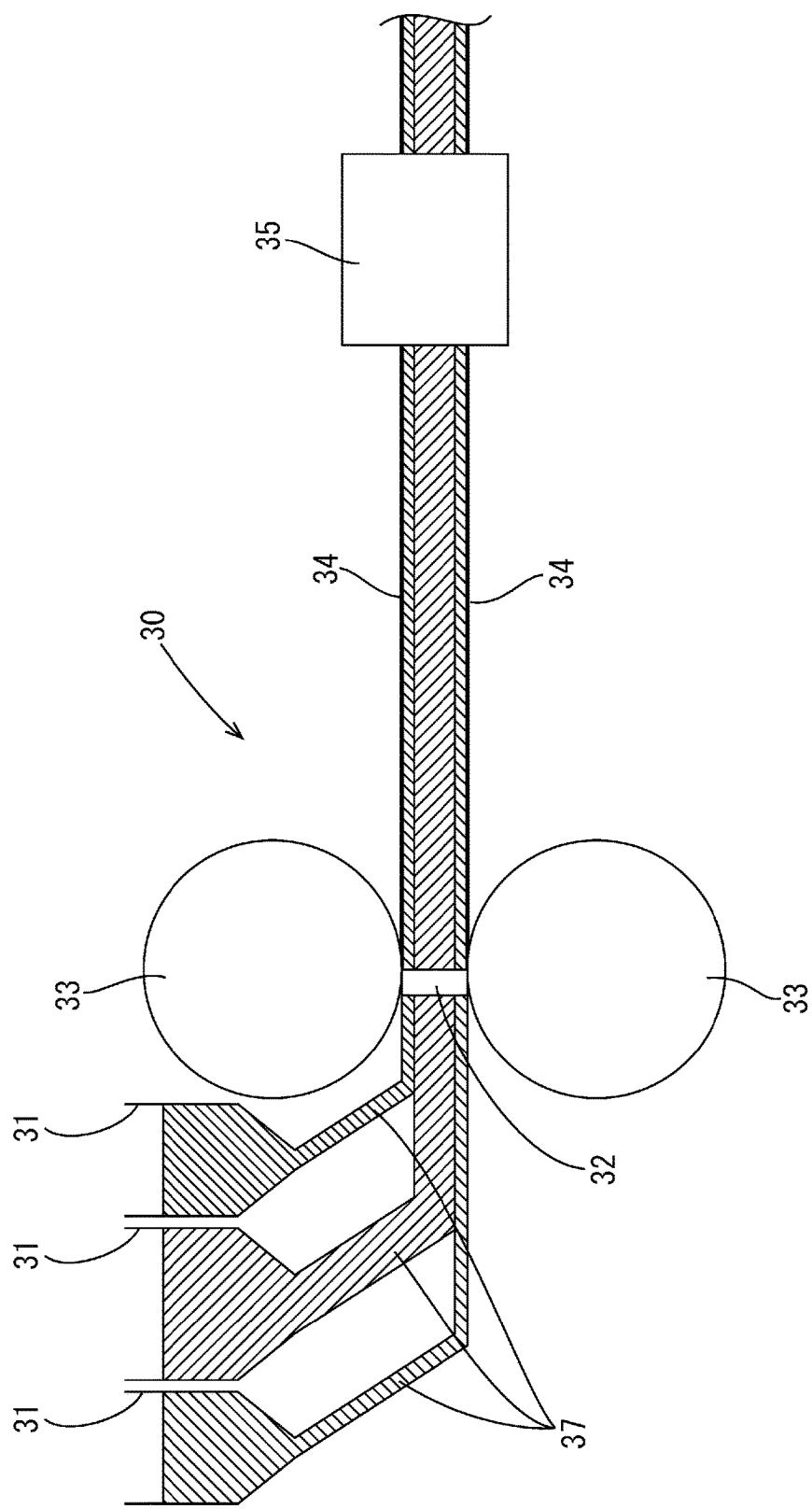
FIG. 4 is a conceptual drawing illustrating a coater schematically.
Figure 5:
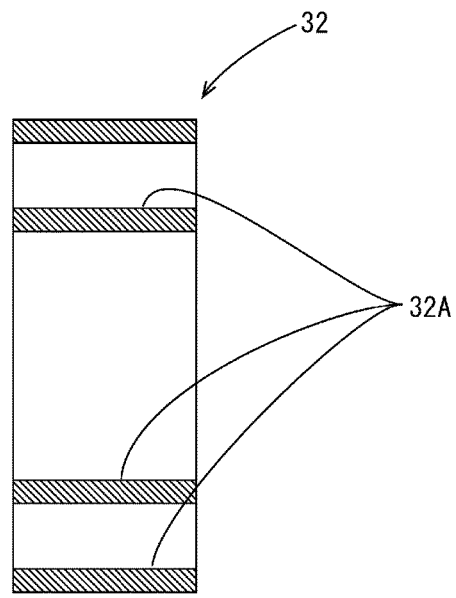
FIG. 5 is a cross-sectional view schematically illustrating a die head.

FIG. 4 is a drawing schematically illustrating a configuration of the coater 30 for producing the thermal conducting sheet 10. FIG. 5 is a drawing schematically illustrating a configuration of the die head 32. Each of the mixtures described above is stored in a hopper 31 individually. Each of the hoppers 31 is connected to each of the three outlets 32A of the die head 32 via a hose 37, allowing each mixture flow into each of the three outlets 32A. More specifically, as illustrated in FIG. 5, the die head 32 has three outlets 32A arranged in up-down direction and each of the hoppers 31 is connected via the hose 37 to each of the outlets 32A, allowing each mixture flow into each of the outlets 32A individually.

The die head 32 is arranged so that the outlets 32A thereof is directed toward a space between a pair of the rollers 33, 33 which are arranged facing each other in the up-down direction. Each of the polymer films 34, 34 is wrapped around each of the pair of the rollers 33, 33. As the rollers 33, 33 turn, the pair of the polymer films 34, 34 are transported in the same direction (opposite to the direction of the hopper 31) spaced at a prescribed distance.

Figure 2:
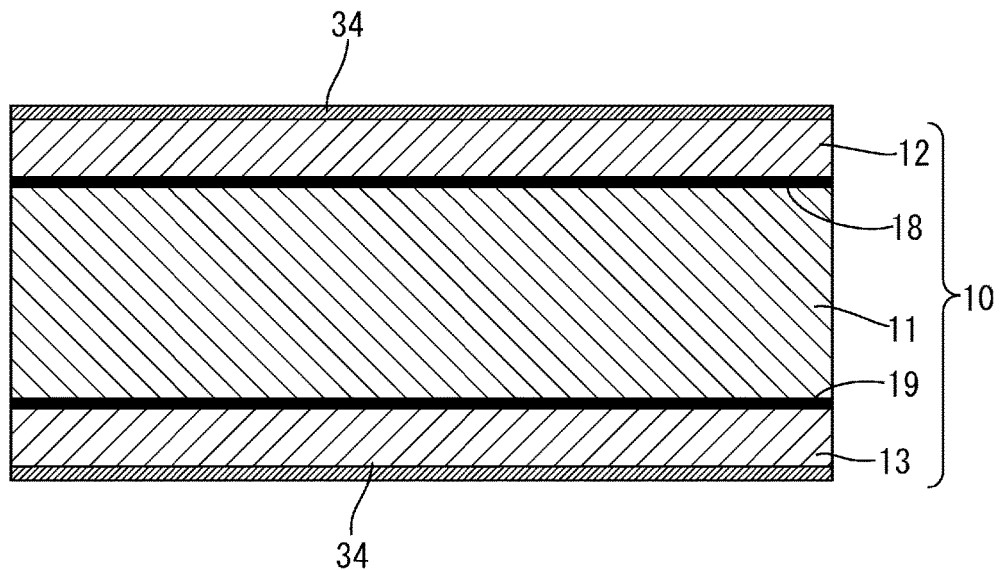
FIG. 2 is a side view schematically illustrating a configuration of a thermal conducting sheet.

While each of the mixtures described above is extruded simultaneously from each of the three outlets 32A and laminated each other (step (ii)) and the extrudate is transported out from the rollers 33, 33 in a state that the extrudate is interposed between the pair of the polymer films 34, 34, the sheet (laminated body) of the defined thickness can be formed (See FIG. 2).

As described, each mixture adjacent to each other can be blended with each other near the interface thereof in a manner that each mixture penetrates into the other, because each mixture extruded has still a low viscosity when extruded into a space between a pair of polymer films 34, 34. At the same time, silicon carbide 15 and the like contained in the composition material (mixture) for the low-hardness layer 11 also penetrate into the composition material (mixture) of the reinforcing layer 12, 13.

Then, the multilayer material, in which mixtures adjacent to each other are blended, react together upon heating in step (iii). The composition materials are cured while polymerized or crosslinked. As such, the first bonding interfacial part 18 and the second bonding interfacial part 19, in which the low-hardness layer 11 and the reinforcing layer 12, 13 penetrate into each other and a part of the silicon carbide 15 penetrates into the reinforcing layer 12, 13, are formed.

In the method described above, the mixture of the composition material for the low-hardness layer 11 preferably has a viscosity higher than that of the mixture of the composition material for the reinforcing layer 12, 13. In such a case, relatively large silicon carbide 15 that is contained in the mixture for the low-hardness layer 11 can move into the mixture for the adjacent reinforcing layers 12, 13, relatively easily. Upon curing afterwards, the thermal conducting sheet 10, in which a part of silicon carbide 15 is disposed in the bonding interfacial part 18, 19 in a manner that a part of the silicon carbide 15 penetrates into the reinforcing layer 12, 13, can be obtained.

Figure 3:
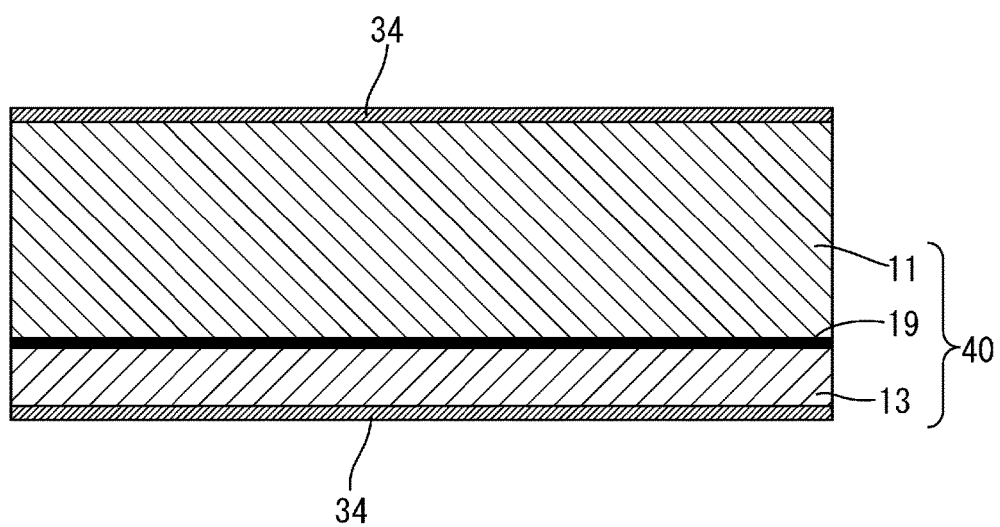
FIG. 3 is a side view schematically illustrating a configuration of a thermal conducting sheet according to another embodiment.

Note that the thermal conducting sheet 40 of the two-layer structure can be produced in the same manner as in the case of the thermal conducting sheet 10 of the three-layer structure described above (See FIG. 3).

EXAMPLES

The embodiments of the present invention are described in detail using examples hereafter. Note that the present invention is not limited to these examples.

Preparation of the Thermal Conducting Sheet 10

Example 1

Three mixtures prepared as each of the composition materials for the first reinforcing layer 12, the low-hardness layer 11, and the second reinforcing layer 13 were mixed in the blending ratios listed in Tables 1, 2 and 3. Among these mixtures, the mixture of the composition materials for the low-hardness layer 11 had a higher viscosity than those of mixtures of the composition materials for the first reinforcing layer 12 and the second reinforcing layer 13.

Next, in the coater 30 described above, each of the composition materials (mixtures) was extruded simultaneously into a space between a pair of the rollers 33, 33 (the polymer films 34, 34) using the die head 32, to form a multilayer material (step (ii)), and thermal polymerization at 105° C. was performed in the oven 35 (step (iii)). Thus, the thermal conducting sheet 10 of the three-layer structure material was prepared.

The production conditions were adjusted so that the thickness of the low-hardness layer 11 was 1.4 mm, the thicknesses of the first reinforcing layer 12 and the second reinforcing layer 13 were both 0.3 mm, for the completed thermal conducting sheet 10. The Asker C hardness of the low-hardness layer 11 was 0, the Asker C hardness of the first reinforcing layer 12 was 38 and the Asker C hardness of the second reinforcing layer 13 was 42.

Example 2

Each of the composition materials for the low-hardness layer 11 and the second reinforcing layer 13 was mixed in the blending ratios listed in Tables 2 and 3. In the similar coater as in the Example 1, each material was extruded simultaneously into a space between a pair of the rollers (polymer films) using a die head for two layer extrusion, to form a two-layer structure material and polymerized by heating at 105° C. Thus, the thermal conducting sheet 40 of the two-layer structure material was prepared. The production conditions were adjusted so that the thickness of the low-hardness layer 11 was 1.7 mm, the thickness of the second reinforcing layer 13 was 0.3 mm, for the completed thermal conducting sheet 40. The Asker C hardness of the low-hardness layer 11 was 0, and the Asker C hardness of the second reinforcing layer 13 was 42.

Comparative Example 1

As Comparative Example 1, each of the composition materials for the low-hardness layer, the first reinforcing layer and the second reinforcing layer was mixed in a blending ratio listed in Tables 1, 2, and 3. In the coater similar to that in Example 1, using a die head for a single layer, each of the layers was formed and cured individually and each of the completed individual single sheets was laminated together via an adhesive. Thus, a multi-layer thermal conducting sheet was prepared. The thickness of the low-hardness layer was adjusted to 1.4 mm, the thicknesses of the first reinforcing layer and the second reinforcing layer were both adjusted to 0.3 mm, for the completed thermal conducting sheet. The Asker C hardness of the low-hardness layer was 0, the Asker C hardness of the first reinforcing layer was 38 and the Asker C hardness of the second reinforcing layer 13 was 42.

TABLE 1

| | Material | | | | | | |
|---|---|---|---|---|---|---|---|
| | Acrylic resin | Multi-functional monomer | Polymerization initiator | Antioxidant | Aluminum hydroxide | Aluminum hydroxide | |
| Manufacturer | Nippon Shokubai Co., Ltd. | Kyoeisha Chemical Co., Ltd. | Kayaku Akzo Corp. | ADEKA | Nippon Light Metal Co., Ltd. | Nippon Light Metal Co., Ltd. | |
| Part No. | HD-A218 | 1.6HX-A | PERKADOX16 | A0-60 | SB303 | BF083 | Total |
| Specific density | 0.98 | 0.98 | 0.50 | 1.04 | 2.42 | 2.42 | |
| Weight (g) | 20.98 | 0.084 | 0.210 | 0.070 | 30.00 | 30.00 | 81.34 |
| Converted to wt % | 25.79 | 0.100 | 0.260 | 0.090 | 36.88 | 36.88 | 100.00 |

TABLE 2

| | Material | | | | | | | | | |
|---|---|---|---|---|---|---|---|---|---|---|
| | Acrylic resin | Multi-functional monomer | Polymerization initiator | Ferrite | Antioxidant | Plasticizer | Silicon carbide | Aluminum hydroxide | Magnesium hydroxide | |
| Manufacturer | Nippon Shokubai Co., Ltd. | Kyoeisha Chemical Co., Ltd. | Kayaku Akzo Corp. | Toda Kogyo Corp. | ADEKA | ADEKA | Pacific Rundum Co., Ltd. | Nippon Light Metal Co., Ltd. | Kounoshima Chemical Co., Ltd. | |
| Part No. | HD-A218 | 1.6HX-A | PERKADOX16 | BSN-714 | AO-60 | C-880 | GC F180 | BF083 | N-4 | Total |
| Specific density | 0.98 | 0.98 | 0.50 | 5.10 | 1.04 | 0.997 | 3.50 | 2.42 | 2.38 | |
| Weight (g) | 20.60 | 0.010 | 0.210 | 1.96 | 0.070 | 3.00 | 34.34 | 19.62 | 22.07 | 101.88 |
| Converted to wt % | 20.22 | 0.010 | 0.210 | 1.92 | 0.070 | 2.94 | 33.71 | 19.26 | 21.66 | 100.00 |

TABLE 3

| | Material | | | | | | | |
|---|---|---|---|---|---|---|---|---|
| | Acrylic resin | Multi-functional monomer | Polymerization initiator | Antioxidant | Aluminum hydroxide | Aluminum hydroxide | Magnesium hydroxide | |
| Manufacturer | Nippon Shokubai Co., Ltd. | Kyoeisha Chemical Co., Ltd. | Kayaku Akzo Corp. | ADEKA | Nippon Light Metal Co., Ltd. | Nippon Light Metal Co., Ltd. | Kounoshima Chemical Co., Ltd. | |
| Part No. | HD-A218 | 1.6HX-A | PERKADOX16 | AO-60 | SB303 | BF083 | N-4 | Total |
| Specific density | 0.98 | 0.98 | 0.50 | 1.04 | 2.42 | 2.42 | 2.38 | |
| Weight (g) | 20.98 | 0.084 | 0.210 | 0.070 | 30.00 | 30.00 | 16.00 | 97.34 |
| Converted to wt % | 21.55 | 0.080 | 0.210 | 0.080 | 30.82 | 30.82 | 16.44 | 100.00 |

Measurement of Compressive Force

For each of the thermal conducting sheets of Examples 1, 2 and Comparative Example 1, a sample piece of the size 10 mm×10 mm was cut out. Using a measurement instrument ("Tensilon Universal Tester, RTC-1210A" available from A and D Co., Ltd.) with a load cell of 500 kgf/cm$^2$, the compressive force was measured under the conditions of cross-head speed of 1.0 mm/min. The measurement results are shown in Table 4 and FIG. 6.

TABLE 4

| Compression ratio | Example 1 | Example 2 | Comparative Example 1 |
|---|---|---|---|
| 10% | 1.1 | 0.8 | 4.8 |
| 20% | 4.7 | 2.4 | 10.0 |
| 30% | 9.8 | 5.6 | 18.7 |
| 40% | 19.6 | 12.7 | 33.7 |
| 50% | 39.5 | 28.4 | 62.7 |

Figure 6:
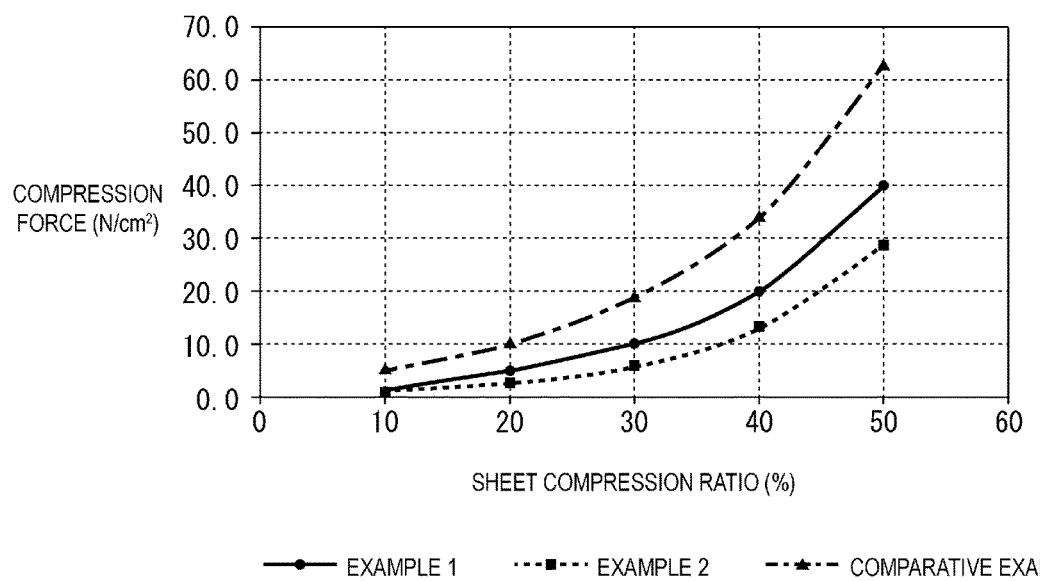
FIG. 6 is a plot of a compression ratio and a compressive force.

From the results shown in Table 4 and FIG. 6, it was confirmed that the compression force at the same compression ratio was smaller for the thermal conducting sheets 10, 40 of Example 1 and Example 2, compared to that of the conventional thermal conducting sheet (Comparative Example 1). This result indicates that the thermal conductive sheets 10, 40 had a superior compliance to an adherend.

In addition, the misalignment between the low-hardness layer and the reinforcing layer was not observed even at the higher compression ratio. Thus, the suppression of the excessive deformation of the low-hardness layer was confirmed. In other words, the higher bonding between the layers was confirmed. On the other hand, the misalignment between the low-hardness layer and the reinforcing layer was present at the higher compression ratio for the Comparative Example 1. It was observed that the low-hardness layer jutted out from the reinforcing layer. Even after the compression force was removed, the low-hardness layer did not recover to the original position and left jutted out from the reinforcing layer.

Such a result is considered to be due to the fact that, in the thermal conducting sheets 10, 40 of Example 1 and 2, the bonding interfacial parts 18, 19, in which the low-hardness layer 11 and the reinforcing layer 12, 13 penetrated each other, promoted the strong bonding between the low-hardness layer 11 and the reinforcing layer 12, 13, as a result of production method described above. Also, it is considered that the part of the silicon carbide 15 contained in the low-hardness layer 11 penetrated into the reinforcing layers 12, 13 and was disposed and anchored in the bonding interfacial part 18, 19.

Measurement of Thermal Resistance

For Example 1 and Comparative Example 1, a sample piece of the size 25 mm×25 mm was cut out and the thermal resistance thereof was measured using the thermal resistance tester in accordance with ASTM D5470. The measurement results are shown in Table 5.

TABLE 5

| | Thermal resistance (° C./W) |
|---|---|
| Example 1 | 1.33 |
| Comparative Example 1 | 1.32 |

From the results in Table 5, it was confirmed that the thermal conducting sheet 10 according to an embodiment of the present invention can achieve the thermal resistance equivalent to that of the conventional ones.

Oil Bleeding Evaluation

For the thermal conducting sheet 10 of the Example 1 described above, a sample piece of the size 25 mm×25 mm was cut out and placed on the medicine paper, the oil bleeding evaluation was conducted by leaving the sample under the temperature of about 20° C. (room temperature) for about 300 hours. Also, the same oil bleeding evaluation was conducted on the commercially available silicon-based thermal conducting sheet.

Observation concluded that oil bleeding was observed for the commercially available silicon-based thermal conducting sheet, but little oil bleeding was observed for the thermal conducting sheet 10 of Example 1.

Confirmation of Releasing Property

Upon removing the polymer films 34 laminated on the both sides of the thermal conducting sheet 10 of Example 1, the polymer film 34 laminated on the second reinforcing layer 13 was easily removed compared to the polymer film 34 laminated on the first reinforcing layer 12. This is considered to be due to the effect of the magnesium hydroxide 17 contained in the second reinforcing layer 13.

Other Embodiments

The present invention is not limited by the preceding recitations and/or the embodiments described using the drawings, and various aspects such as the following should be construed to be included in the scope of the technology disclosed in the present invention.

(1) The thermal conducting sheet may be constructed so that the reinforcing layers 13 are disposed on both sides of the low-hardness layer 11. Such a thermal conducting sheet may be realized by bonding a pair of the thermal conducting sheets 40 that has a configuration of Example 2 above, for example, in which a reinforcing layer 13 is disposed on one side of the low-hardness layer 11, so that the sides of the low-hardness layers 11 face each other. In this case, the low-hardness layers 11 bonded together have high viscosity and blend each other easily, therefore are unlikely to be misaligned at the interface.

(2) The first reinforcing layer 12 and the second reinforcing layer 13 have different compositions in Example 1. But they may have the same composition.

(3) The thickness and the hardness of the low-hardness layer 11, the first reinforcing layer 12, and the second reinforcing layer 13 are not limited to the embodiments described above, but can be adjusted as appropriate.

REFERENCE SIGNS LIST 10, 40 Thermal conducting sheet
11 Low-hardness layer
12 First reinforcing layer
13 Second reinforcing layer
14 Acrylic polymer
15 Silicon carbide
16 Aluminum hydroxide
17 Magnesium hydroxide
18 First bonding interfacial part
19 Second bonding interfacial part
30 Coater
32 Die head
32A Outlet
33 Roller
34 Polymer film
35 Oven

The invention claimed is:

1. A thermal conducting sheet comprising a low-hardness layer and a reinforcing layer laminated on one side or both sides of the low-hardness layer, the reinforcing layer having a hardness greater than a hardness of the low-hardness layer;
   wherein the low-hardness layer comprises:
   from 18 to 25 mass % of acrylic polymer,
   from 30 to 35 mass % of silicon carbide having an average particle size of from 60 µm to 100 µm,
   from 15 to 23 mass % of aluminum hydroxide having an average particle size of from 10 µm to 50 µm,
   from 18 to 30 mass % of magnesium hydroxide having an average particle size of from 1 µm to 2 µm, and
   from 1 to 5 mass % of plasticizer; and
   the reinforcing layer comprises:
   from 20 to 30 mass % of acrylic polymer and from 60 to 80 mass % of aluminum hydroxide having an average particle size of from 10 µm to 50 µm; and
   the thermal conducting sheet comprises a bonding interfacial part, the bonding interfacial part comprising an interfacial portion; wherein the low-hardness layer and the reinforcing layer are mutually bonded in the interfacial portion, and each of the low-hardness layer and the reinforcing layer penetrates into the bonding interfacial part.

2. The thermal conducting sheet according to claim 1, wherein a part of the silicon carbide is disposed in the bonding interfacial part, the part of the silicon carbide penetrating into the reinforcing layer.

3. The thermal conducting sheet according to claim 2, wherein a pair of the reinforcing layers is laminated on both sides of the low-hardness layer, and one of the pair of the reinforcing layers comprises from 15 to 20 mass % of magnesium hydroxide having an average particle size of from 1 to 2 µm.

4. A method for producing the thermal conducting sheet described in claim 3, comprising:
   (i) mixing each of a composition material for the low-hardness layer and a composition material for the reinforcing layer individually, wherein:
   the composition material for the low-hardness layer comprises:
   an acrylic resin comprising a polymer that is polymerized from a monomer containing (meth)acrylate, and (meth)acrylate,
   a multifunctional monomer,
   a thermal polymerization initiator,
   a plasticizer,
   silicon carbide,
   aluminum hydroxide and
   magnesium hydroxide; and
   the composition material for the reinforcing layer comprises:
   an acrylic resin comprising a polymer that is polymerized from a monomer containing (meth)acrylate, and (meth)acrylate,
   a multifunctional monomer,
   a thermal polymerization initiator, and
   aluminum hydroxide;
   (ii) extruding each composition mixed in step (i) simultaneously into a space between a pair of polymer films facing each other via a die head having multiple outlets, to form a multilayer material; and
   (iii) curing the multilayer material extruded in step (ii) by heating the multilayer material.

5. The method for producing the thermal conducting sheet according to claim 4, wherein a viscosity of a mixture of the composition material for the low-hardness layer is higher than a viscosity of a mixture of the composition material for the reinforcing layer.

6. A method for producing the thermal conducting sheet described in claim 2, comprising:
   (i) mixing each of a composition material for the low-hardness layer and a composition material for the reinforcing layer individually, wherein:
   the composition material for the low-hardness layer comprises:
   an acrylic resin comprising a polymer that is polymerized from a monomer containing (meth)acrylate, and (meth)acrylate,
   a multifunctional monomer,
   a thermal polymerization initiator,
   a plasticizer,
   silicon carbide,
   aluminum hydroxide and
   magnesium hydroxide; and
   the composition material for the reinforcing layer comprises:
   an acrylic resin comprising a polymer that is polymerized from a monomer containing (meth)acrylate, and (meth)acrylate,
   a multifunctional monomer,
   a thermal polymerization initiator, and
   aluminum hydroxide;
   (ii) extruding each composition mixed in step (i) simultaneously into a space between a pair of polymer films facing each other via a die head having multiple outlets, to form a multilayer material; and
   (iii) curing the multilayer material extruded in step (ii) by heating the multilayer material.

7. The method for producing the thermal conducting sheet described in claim 6, wherein a viscosity of a mixture of the composition material for the low-hardness layer is higher than a viscosity of a mixture of the composition material for the reinforcing layer.

8. The thermal conducting sheet according to claim 1, wherein a pair of the reinforcing layers is laminated on both sides of the low-hardness layer, and one of the pair of the reinforcing layers comprises from 15 to 20 mass % of magnesium hydroxide having an average particle size of from 1 to 2 µm.

9. A method for producing the thermal conducting sheet described in claim 8, comprising:
   (i) mixing each of a composition material for the low-hardness layer and a composition material for the reinforcing layer individually, wherein:
   the composition material for the low-hardness layer comprises:
   an acrylic resin comprising a polymer that is polymerized from a monomer containing (meth)acrylate, and (meth)acrylate,
   a multifunctional monomer,
   a thermal polymerization initiator,
   a plasticizer,
   silicon carbide,
   aluminum hydroxide and
   magnesium hydroxide; and
   the composition material for the reinforcing layer comprises:
   an acrylic resin comprising a polymer that is polymerized from a monomer containing (meth)acrylate, and (meth)acrylate, a multifunctional monomer,
a thermal polymerization initiator, and
aluminum hydroxide;
(ii) extruding each composition mixed in step (i) simultaneously into a space between a pair of polymer films facing each other via a die head having multiple outlets, to form a multilayer material; and
(iii) curing the multilayer material extruded in step (ii) by heating the multilayer material.

10. The method for producing the thermal conducting sheet described in claim 9, wherein a viscosity of a mixture of the composition material for the low-hardness layer is higher than a viscosity of a mixture of the composition material for the reinforcing layer.

11. A method for producing the thermal conducting sheet described in claim 1, comprising:
(i) mixing each of a composition material for the low-hardness layer and a composition material for the reinforcing layer individually, wherein:
the composition material for the low-hardness layer comprises:
an acrylic resin comprising a polymer that is polymerized from a monomer containing (meth)acrylate, and (meth)acrylate,
a multifunctional monomer,
a thermal polymerization initiator,
a plasticizer,
silicon carbide,
aluminum hydroxide and
magnesium hydroxide; and
the composition material for the reinforcing layer comprises:
an acrylic resin comprising a polymer that is polymerized from a monomer containing (meth)acrylate, and (meth)acrylate,
a multifunctional monomer,
a thermal polymerization initiator, and
aluminum hydroxide;
(ii) extruding each composition mixed in step (i) simultaneously into a space between a pair of polymer films facing each other via a die head having multiple outlets, to form a multilayer material; and
(iii) curing the multilayer material extruded in step (ii) by heating the multilayer material.

12. The method for producing the thermal conducting sheet described in claim 11, wherein a viscosity of a mixture of the composition material for the low-hardness layer is higher than a viscosity of a mixture of the composition material for the reinforcing layer.

* * * * *